(12) United States Patent  
Omura

(10) Patent No.: US 12,395,149 B2
(45) Date of Patent: Aug. 19, 2025

(54) ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 455 days.

(21) Appl. No.: 17/831,508

(22) Filed: Jun. 3, 2022

(65) Prior Publication Data

US 2022/0294417 A1 Sep. 15, 2022

Related U.S. Application Data

(63) Continuation of application No. PCT/JP2020/045191, filed on Dec. 4, 2020.

(30) Foreign Application Priority Data

Dec. 6, 2019 (JP) .................................. 2019-221052

(51) Int. Cl.
*H03H 9/17* (2006.01)
*H03H 9/02* (2006.01)
(Continued)

(52) U.S. Cl.
CPC ........ *H03H 9/173* (2013.01); *H03H 9/02015* (2013.01); *H03H 9/02157* (2013.01); *H03H 9/132* (2013.01); *H03H 9/568* (2013.01)

(58) Field of Classification Search
CPC ............... H03H 9/173; H03H 9/02015; H03H 9/02157; H03H 9/132; H03H 9/568
See application file for complete search history.

(56) References Cited

U.S. PATENT DOCUMENTS

2006/0255883 A1 11/2006 Ebuchi
2007/0210878 A1 9/2007 Yamaguchi et al.
(Continued)

FOREIGN PATENT DOCUMENTS

CN 1862956 A 11/2006
CN 107404304 A 11/2017
(Continued)

OTHER PUBLICATIONS

International Search Report in PCT/JP2020/045191, mailed Mar. 2, 2021, 6 pages.
(Continued)

*Primary Examiner* — Samuel S Outten
(74) *Attorney, Agent, or Firm* — Keating & Bennett, LLP

(57) ABSTRACT

An acoustic wave device includes a piezoelectric member, a first and second electrodes on first and second main surfaces of the piezoelectric member, an acoustic reflection section including an air gap, and an additional mass film in at least one of areas on the first and second electrodes and an area outward of the first or second electrodes. A region where at least one of the first electrode and the additional mass film overlaps the second electrode includes a first region and a second region surrounding the first region. In the second region, a configuration of additional mass film portions on corresponding sides of a first direction in a plane of the piezoelectric member and a configuration of additional mass film portions on corresponding sides of a second direction in the plane of the piezoelectric member are different from each other.

16 Claims, 17 Drawing Sheets

(51) Int. Cl.
*H03H 9/13* (2006.01)
*H03H 9/56* (2006.01)

(56) References Cited

U.S. PATENT DOCUMENTS

| | | |
|---|---|---|
| 2008/0174389 A1 | 7/2008 | Mori et al. |
| 2010/0134210 A1* | 6/2010 | Umeda ............. H03H 3/04 |
| | | 333/187 |
| 2010/0327697 A1* | 12/2010 | Choy ............. H03H 9/132 |
| | | 333/187 |
| 2011/0037539 A1* | 2/2011 | Jansman ........... H03H 9/175 |
| | | 29/25.35 |
| 2016/0118958 A1* | 4/2016 | Burak ............. H03H 9/175 |
| | | 333/187 |
| 2017/0338399 A1 | 11/2017 | Kim et al. |
| 2020/0169245 A1 | 5/2020 | Matsuda et al. |

FOREIGN PATENT DOCUMENTS

| | | |
|---|---|---|
| DE | 102007000133 A1 | 11/2007 |
| EP | 1887688 A1 | 2/2008 |
| JP | 2005159402 A | 6/2005 |
| JP | 2006319796 A | 11/2006 |
| JP | 2008042871 A | 2/2008 |
| JP | 2009055128 A | 3/2009 |
| JP | 202088680 A | 6/2020 |
| KR | 1020170130228 A | 11/2017 |
| TW | 200644049 A | 12/2006 |
| WO | 2006129532 A1 | 12/2006 |
| WO | 2009013938 A1 | 1/2009 |
| WO | 2013031748 A1 | 3/2013 |

OTHER PUBLICATIONS

Written Opinion in PCT/JP2020/045191, mailed Mar. 2, 2021, 7 pages.

* cited by examiner

ACOUSTIC WAVE DEVICE

CROSS REFERENCE TO RELATED APPLICATIONS

This application claims the benefit of priority to Japanese Patent Application No. 2019-221052 filed on Dec. 6, 2019 and is a Continuation Application of PCT Application No. PCT/JP2020/045191 filed on Dec. 4, 2020. The entire contents of each application are hereby incorporated herein by reference.

BACKGROUND OF THE INVENTION

1. Field of the Invention

The present invention relates to an acoustic wave device including an electrode on each of main surfaces of a piezoelectric member.

2. Description of the Related Art

Hitherto, various acoustic wave devices using bulk waves propagating through a piezoelectric member are known. For example, in the acoustic wave device disclosed in the following Japanese Unexamined Patent Application Publication No. 2005-159402, a multilayer body including a lower electrode, a piezoelectric member, and an upper electrode is disposed on an air gap or an acoustic reflector. To suppress spurious responses, in the structure disclosed in Japanese Unexamined Patent Application Publication No. 2005-159402, the thickness of the upper electrode on a first region, which is a central portion, where main resonance is produced is made thinner than that of the upper electrode on a second region around the first region. Alternatively, the thickness of the upper electrode on the first region is made thicker than that of the upper electrode on the second region.

In an acoustic wave device, such as that disclosed in Japanese Unexamined Patent Application Publication No. 2005-159402, with the use of a piezoelectric member having anisotropic properties in the direction parallel with the main surfaces of the piezoelectric member, spurious responses are not always suppressed sufficiently.

SUMMARY OF THE INVENTION

Preferred embodiments of the present invention provide acoustic wave devices that are each able to sufficiently reduce or prevent spurious responses even with the use of a piezoelectric member having anisotropic properties in a plane parallel or substantially parallel with first and second main surfaces of the piezoelectric member.

An acoustic wave device according to a preferred embodiment of the present invention includes a piezoelectric member that includes a first main surface and a second main surface opposing each other and having anisotropic properties in a plane parallel or substantially parallel with the first and second main surfaces, a first electrode on the first main surface of the piezoelectric member, a second electrode on the second main surface of the piezoelectric member and opposing the first electrode with the piezoelectric member interposed therebetween, an acoustic reflection section on a surface of the second electrode different from a surface of the second electrode on the piezoelectric member, and an additional mass film for at least one of the first electrode and the second electrode, the additional mass film being disposed in at least one of an area on the first electrode or the second electrode and an area outward of the first electrode or the second electrode. As viewed from above, a region where at least one of the first electrode and the additional mass film overlaps the second electrode includes a first region and a second region which surrounds the first region. In the second region, a configuration of additional mass film portions of the additional mass film located on corresponding sides of a first direction in a plane of the piezoelectric member and a configuration of additional mass film portions of the additional mass film located on corresponding sides of a second direction, the second direction being different from the first direction, in the plane of the piezoelectric member are different from each other.

An acoustic wave device according to a preferred embodiment of the present invention includes a piezoelectric member including a first main surface and a second main surface opposing each other and having anisotropic properties in a plane parallel or substantially parallel with the first and second main surfaces, a first electrode on the first main surface of the piezoelectric member, a second electrode on the second main surface of the piezoelectric member and opposing the first electrode with the piezoelectric member interposed therebetween, and an acoustic reflection section on a surface of the second electrode different from a surface of the second electrode on the piezoelectric member. An excitation region where the first electrode and the second electrode oppose each other includes a first region and a second region which surrounds the first region. A thickness of at least one of the first electrode and the second electrode in the second region is thinner than a thickness of the at least one of the first electrode and the second electrode in the first region. In the second region, a configuration of the first electrode and the second electrode located on corresponding sides of a first direction in a plane of the piezoelectric member and a configuration of the first electrode and the second electrode located on corresponding sides of a second direction, the second direction being different from the first direction, in the plane of the piezoelectric member are different from each other.

According to preferred embodiments of the present invention, it is possible to sufficiently reduce or prevent spurious responses even with the use of a piezoelectric member having anisotropic properties in a plane parallel or substantially parallel with first and second main surfaces of the piezoelectric member.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below through illustration of specific preferred embodiments of the present invention with reference to the drawings.

The individual preferred embodiments described in the specification are only examples. The configurations discussed in different preferred embodiments may be partially replaced by or combined with each other.

Figure 1A:
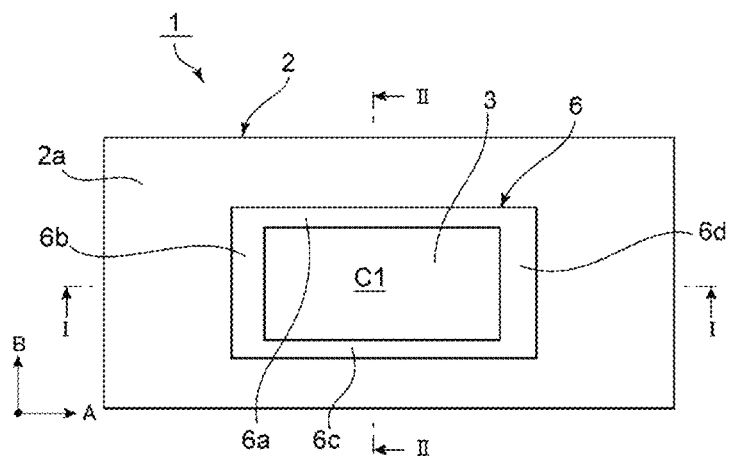
FIG. 1A is a plan view of an acoustic wave device according to a first preferred embodiment of the present invention.
Figure 1B:
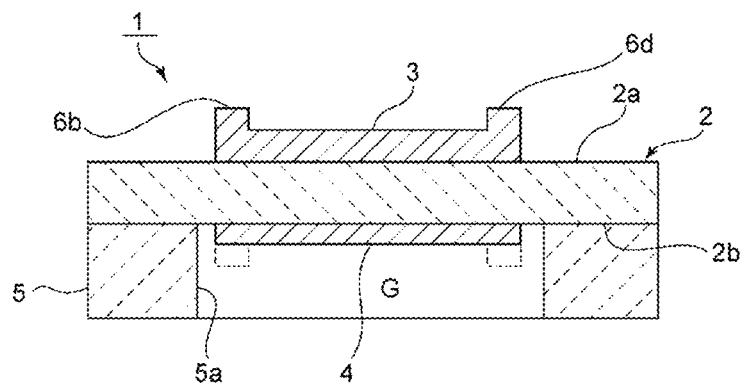
FIG. 1B is a sectional view taken along line I-I in FIG. 1A.
Figure 1C:
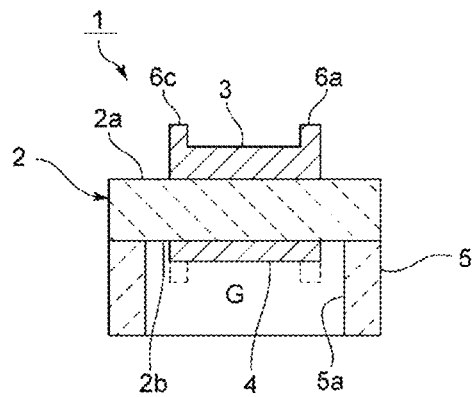
FIG. 1C is a sectional view taken along line II-II in FIG. 1A.

FIG. 1A is a plan view of an acoustic wave device according to a first preferred embodiment of the present invention. FIG. 1B is a sectional view taken along line I-I in FIG. 1A. FIG. 1C is a sectional view taken along line II-II in FIG. 1A.

An acoustic wave device 1 includes a piezoelectric member 2. The piezoelectric member 2 includes a first main surface 2a and a second main surface 2b. The first main surface 2a opposes the second main surface 2b.

The piezoelectric member 2 has anisotropic properties in a plane parallel or substantially parallel with the first main surface 2a and the second main surface 2b. The anisotropic properties are assumed as those in which crystalline characteristics are different between first and second different directions, in the above-described plane, and the propagation characteristics of acoustic waves in the acoustic device becomes different. Examples of a material having such anisotropic properties is a single-crystal piezoelectric material, such as $LiTaO_3$ or $LiNbO_3$. In the present preferred embodiment, the piezoelectric member 2 is made of, for example, $LiTaO_3$.

A first electrode 3 is disposed on the first main surface 2a of the piezoelectric member 2, while a second electrode 4 is disposed on the second main surface 2b. The first electrode 3 and the second electrode 4 oppose each other with the piezoelectric member 2 interposed therebetween. A region where the first electrode 3 and the second electrode 4 oppose each other is an excitation region. As a result of applying an AC voltage to between the first electrode 3 and the second electrode 4, bulk waves are excited as acoustic waves.

As the bulk waves, various modes of bulk waves can be used. For example, by selecting the cut angle of LiTaO₃ or LiNbO₃, resonance characteristics using bulk waves in the thickness shear mode or those in the thickness longitudinal mode can be obtained.

A support member 5 is disposed on the second main surface 2b. The support member 5 includes a cavity 5a in which the second electrode 4 is located. With this configuration, an air gap G is provided under the second electrode 4. The air gap G is provided as an acoustic reflection section to trap therein acoustic waves generated in the excitation region of the piezoelectric member 2. The air gap G makes it less likely to cause interference with the vibration in the excitation region.

The support member 5 is made of a suitable material, such as, for example, an insulator or a semiconductor. More specific examples are alumina and silicon nitride as an insulator and Si as a semiconductor.

In the acoustic wave device 1, an additional mass film 6 is disposed on the top surface of the first electrode 3. In the acoustic wave device 1, as viewed from above, a region where at least one of the first electrode 3 and the additional mass film 6 overlaps the second electrode 4 includes a first region C1 and a second region which surrounds the first region C1. In the acoustic wave device 1, the additional mass film 6 surrounds the first region C1. That is, the region surrounded by the frame-shaped additional mass film 6 is the first region C1, while the region below the additional mass film 6 is the second region, as viewed from above. In the present preferred embodiment, the additional mass film 6 disposed in the second region is integrally provided with the first material 3 by using the same material as the first electrode 3. Alternatively, the additional mass film 6 may be made of a material different from the first electrode 3. The additional mass film 6 may be provided in a portion of the second region. That is, it is not necessary that the region where the additional mass film 6 is provided matches the second region.

As shown in FIG. 1A, the excitation region has a rectangular or substantially rectangular shape. The additional mass film 6, which is a frame-shaped projecting section, includes a pair of additional mass film portions 6a and 6c on the long sides and a pair of additional mass film portions 6b and 6d on the short sides. In FIG. 1A, the extending direction of the additional mass film portions 6a and 6c is defined as a first direction A, while that of the additional mass film portions 6b and 6d is defined as a second direction B.

As shown in FIGS. 1A through 1C, the widths of the additional mass film portions 6a and 6c extending in the first direction A and those of the additional mass film portions 6b and 6d extending in the second direction B are different from each other. More specifically, the widths of the additional mass film portions 6b and 6d are larger than those of the additional mass film portions 6a and 6c. The additional mass film 6 surrounding the first region C1 may be divided into some portions. That is, in FIG. 1A, it may be possible that the four sides of the additional mass film portions 6a through 6d are not entirely connected with each other and a gap may be provided in at least one portion within the second region.

As described above, the piezoelectric member 2 has anisotropic properties in a plane parallel or substantially parallel with the first main surface 2a and the second main surface 2b. With the use of the piezoelectric member 2 having such anisotropic properties, if a frame-shaped structure the same as or similar to a known structure using an isotropic piezoelectric material is provided, large multiple spurious responses have sometimes appeared in the resonance characteristics of a resonator. In contrast, in the acoustic wave device 1, in the above-described plane, the additional mass film 6 is provided in the second region and the widths of the additional mass film portions 6b and 6d are made larger than those of the additional mass film portions 6a and 6c. This configuration can effectively reduce or prevent the above-described spurious responses. The widths of the additional mass film portions 6b and 6d located on the corresponding sides of the first direction A and those of the additional mass film portions 6a and 6c located on the corresponding sides of the second direction B are different from each other. This can reduce or prevent the influence of the anisotropic properties of the piezoelectric member 2, thus reducing or preventing spurious responses. This will be explained more specifically with reference to FIGS. 2 through 12.

Figure 2:
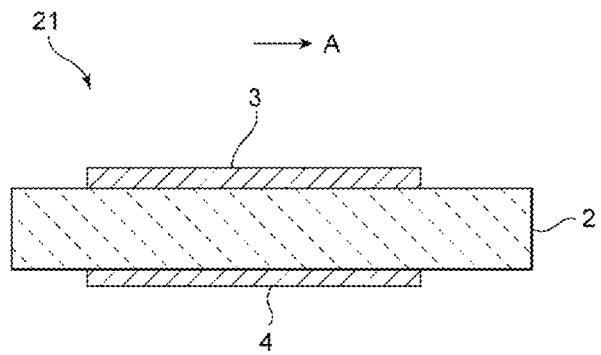
FIG. 2 is a schematic front sectional view for explaining the structure of a two-dimensional model of an acoustic wave device without an additional mass film.

The characteristics of an acoustic wave device 21 illustrated in FIG. 2, which is a two-dimensional model, were evaluated. The measurement conditions for the acoustic wave device 21 shown in FIG. 2 are as follows.

For the piezoelectric member 2, X-cut LiTaO₃ was used, the angle φ was about 40°, where φ is the angle formed with respect to the Y axis, which corresponds to (about 90°, about 90°, about) 40°) in terms of the Euler angles, and the thickness was about 2 µm.

For the first electrode 3 and the second electrode 4, an Al film was used, the thickness was about 0.2 µm, and the planar shape was about 50-µm×about 50-µm square.

Figure 3A:
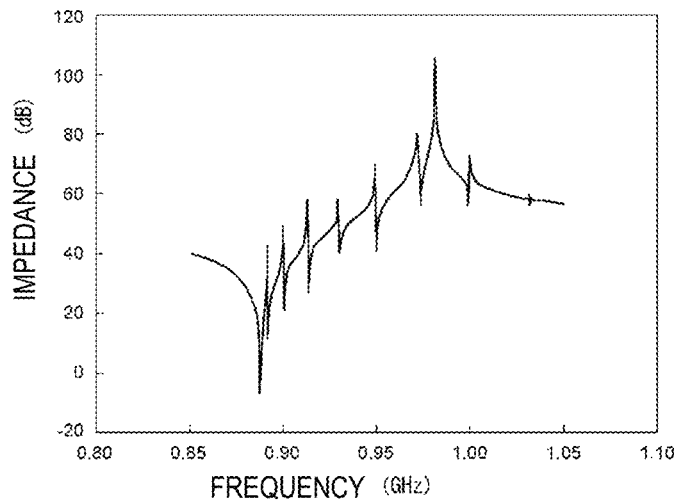
FIG. 3A is a diagram illustrating the resonance characteristics regarding a first direction A of an acoustic wave device without an additional mass film, based on the acoustic wave device shown in FIG. 2.

Based on the acoustic wave device 21, which is a two-dimensional model, the resonance characteristics regarding the first direction A when the additional mass film 6 was not provided were determined. The resonance characteristics in FIG. 3A show that many spurious responses are observed between the resonant frequency and the anti-resonant frequency.

Then, the resonance characteristics regarding the second direction B when the additional mass film 6 was not provided on the corresponding sides of the second direction B were determined. The conditions for a two-dimensional model were as follows.

For the piezoelectric member 2, LiTaO₃ was used, the angle φ was about 130°, and the thickness was about 2 µm.

For the first electrode 3 and the second electrode 4, an Al film was used, the thickness was about 0.2 µm, and the planar shape was about 50-µm×about 50-µm square.

Figure 3B:
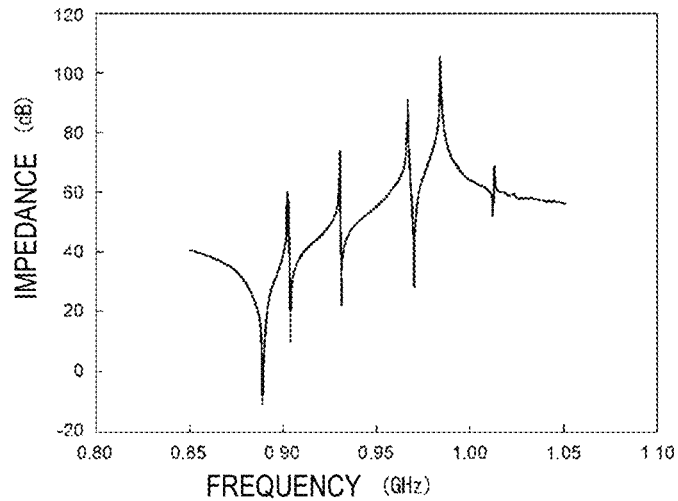
FIG. 3B is a diagram illustrating the resonance characteristics regarding a second direction B of an acoustic wave device without a frame-shaped section.

The resonance characteristics regarding the second direction B when the additional mass film 6 was not provided are illustrated in FIG. 3B. In this case, as well, three large spurious responses are observed between the resonant frequency and the anti-resonant frequency. The resonance characteristics in FIG. 3A and those in FIG. 3B show that the appearance pattern of spurious responses is considerably different between the first direction A and the second direction B. This shows that, because of the anisotropic properties of the piezoelectric member 2 in its plane, the characteristics of the acoustic wave device 21 vary in accordance with the direction in this plane.

Figure 4:
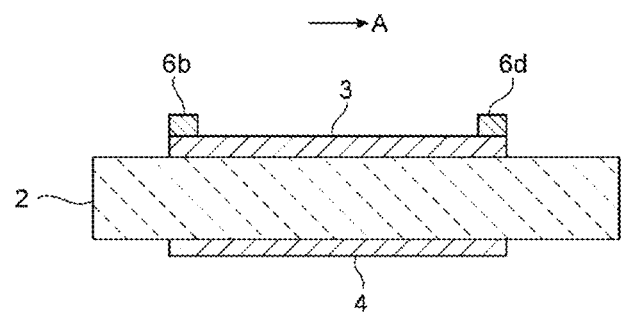
FIG. 4 is a schematic front sectional view illustrating the structure of a two-dimensional model of an acoustic wave device provided with a frame-shaped section.

In view of the above-described issue, as shown in FIG. 4, a two-dimensional model in which the additional mass film portions 6b and 6d were provided on the first electrode 3 on the corresponding sides of the first direction A was considered. The conditions are as follows.

For the piezoelectric member 2, LiTaO$_3$ was used, the angle φ was about 40°, and the thickness was about 2 μm.

For the first electrode 3 and the second electrode 4, an Al film was used, the thickness was about 0.2 μm, and the planar shape was about 50-μm×about 50-μm square.

For the additional mass film 6, an Al film was used, and the additional mass film portions 6b and 6d had a thickness of about 0.22 μm and a width of about 1.6 μm.

Figure 5A:
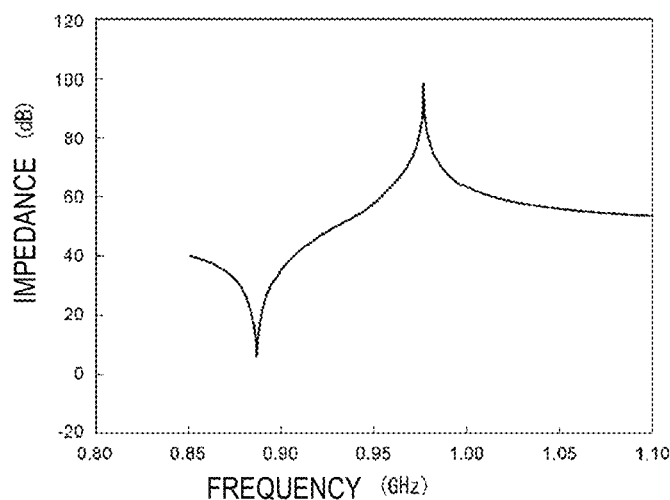
FIG. 5A is a diagram illustrating the resonance characteristics of the two-dimensional model of the acoustic wave device shown in FIG. 4 having an optimal frame-shaped section for the first direction A.

The resonance characteristics of this two-dimensional model are illustrated in FIG. 5A. These resonance characteristics are the best characteristics obtained as a result of varying the thickness and the width of the additional mass film portions 6b and 6d. The resonance characteristics in FIG. 5A show that almost no spurious responses are observed between the resonant frequency and the anti-resonant frequency.

The width of the additional mass film portions 6b and 6d of the two-dimensional model having exhibited the effect of reducing or preventing spurious responses for the first direction A was changed. The thickness of the additional mass film portions 6b and 6d was set to about 0.22 μm, while the width of the additional mass film portions 6b and 6d was set to about 3.1 μm. The resulting resonance characteristics are shown in FIG. 5B.

Figure 5B:
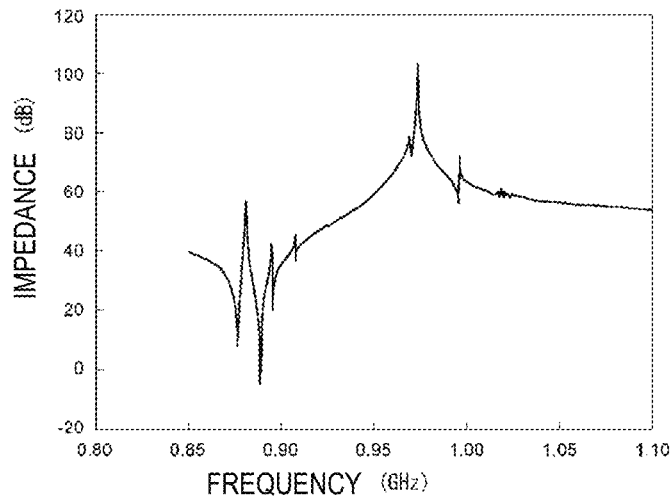
FIG. 5B is a diagram illustrating the resonance characteristics regarding the first direction A of the two-dimensional model of the acoustic wave device shown in FIG. 4 having an optimal frame-shaped section for the second direction B.

As illustrated in FIG. 5B, a considerable number and amount of spurious responses are observed between the resonant frequency and the anti-resonant frequency and also near the resonant frequency. This shows that, even if the optimal value for the second direction B is applied to the first direction A, the effect of reducing or preventing spurious responses is not exhibited.

Then, the resonance characteristics regarding the second direction B were optimized by using an acoustic wave device, which is the following two-dimensional model.

For the piezoelectric member 2, LiTaO$_3$ was used, the angle φ was about 130°, and the thickness was about 2 μm.

For the first electrode 3 and the second electrode 4, an Al film was used, the thickness was about 0.2 μm, and the planar shape was about 50-μm×about 50-μm square.

The thickness of the additional mass film portions 6b and 6d was about 0.22 μm and the width thereof was about 1.6 μm.

Figure 6A:
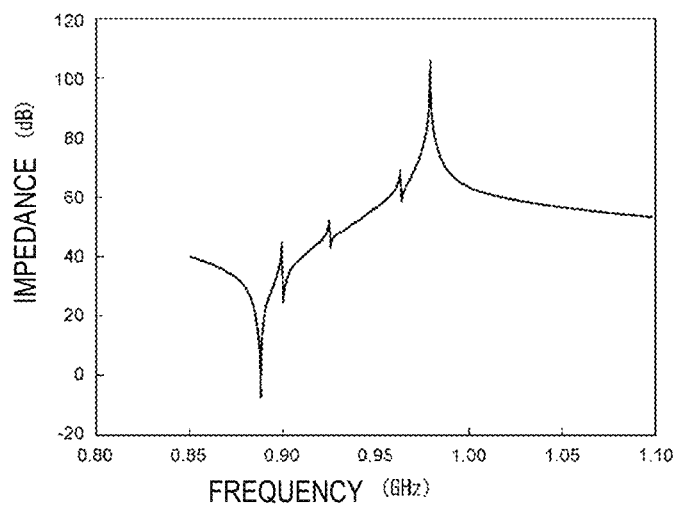
FIG. 6A is a diagram illustrating the resonance characteristics regarding the second direction B of the two-dimensional model of the acoustic wave device shown in FIG. 4 having an optimal frame-shaped section for the first direction A.

The resonance characteristics of the two-dimensional model regarding the second direction B illustrated in FIG. 6A show that, even by optimizing the structure of the additional mass film portions 6b and 6d, which are portions of the additional mass film 6 on the corresponding sides of the first direction A, spurious responses are still observed between the resonant frequency and the anti-resonant frequency.

Then, the conditions for obtaining the optimal resonance characteristics regarding the second direction B were determined by adjusting the structure of the additional mass film portions 6b and 6d on the corresponding sides of the first direction A.

The thickness of the additional mass film portions 6b and 6d were about 0.22 μm, and the width thereof was about 3.1 μm. The other setting conditions were the same or substantially the same as those of the two-dimensional model having exhibited the characteristics shown in FIG. 6A.

Figure 6B:
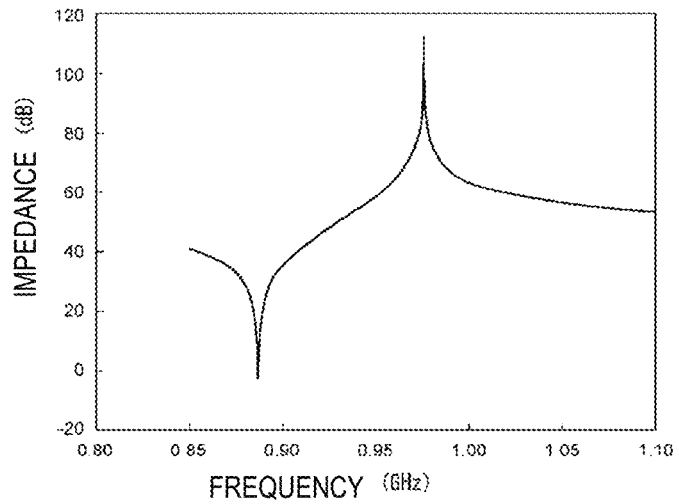
FIG. 6B is a diagram illustrating the resonance characteristics of the two-dimensional model of the acoustic wave device shown in FIG. 4 having an optimal frame-shaped section for the second direction B.

The resonance characteristics in FIG. 6B show that no spurious responses are observed between the resonant frequency and the anti-resonant frequency.

The results of FIGS. 5A, 5B, FIGS. 6A, and 6B show that the structure of the additional mass film portions that does not cause spurious responses for the first direction A is different from that for the second direction B.

Based on the examination results obtained by using the above-described two-dimensional models, the inventor of preferred embodiments of the present invention made a study of the configurations of additional mass film portions by using an acoustic wave device 31, which is the following three-dimensional model.

Figure 7:
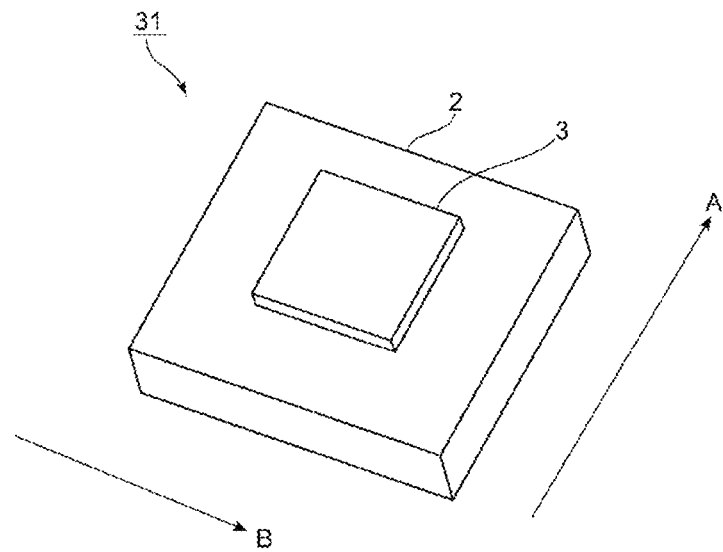
FIG. 7 is a perspective view for explaining the structure of a three-dimensional model of an acoustic wave device without a frame-shaped section.

In this three-dimensional model, as shown in FIG. 7, the first electrode 3 is disposed on the top surface of the piezoelectric member 2. The second electrode is disposed on the second main surface of the piezoelectric member 2 so as to oppose the first electrode 3, although it is not shown in FIG. 7.

The first direction A and the second direction B are set as shown in FIG. 7. That is, the direction extending in one of adjacent sides of the square first electrode 3 is the first direction A, while the direction extending in the other one of the adjacent sides is the second direction B. Accordingly, as in the acoustic wave device 1, the second direction B is perpendicular or substantially perpendicular to the first direction A.

In the present preferred embodiment, the angle between the first direction A and the second direction B is not limited to about 90°. It may be any degree of angle as long as the second direction B is not the same or substantially the same direction as the first direction A.

The conditions for the set three-dimensional model are as follows.

For the piezoelectric member 2, X-cut LiTaO$_3$ was used, the first direction A was a direction having an angle φ of about 130°, and the thickness was about 2 μm.

For the first electrode 3 and the second electrode 4, an Al film was used, the thickness was about 0.2 μm, and the planar shape was about 50-μm×about 50-μm square. The additional mass film 6 was not provided.

Figure 8:
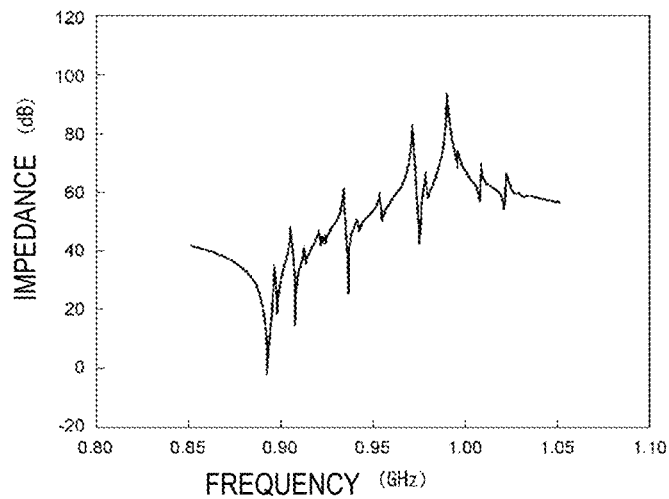
FIG. 8 is a diagram illustrating the resonance characteristics of the three-dimensional model shown in FIG. 7 having a structure without a frame-shaped section.

The resonance characteristics of the above-described three-dimensional model are illustrated in FIG. 8. Many large spurious responses are observed between the resonant frequency and the anti-resonant frequency.

Figure 9A:
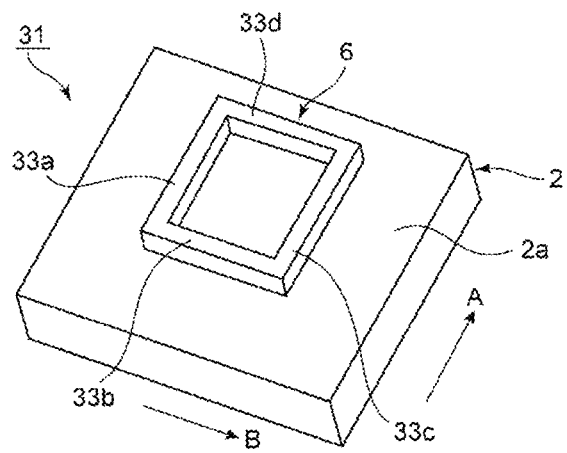
FIG. 9A is a perspective view for explaining the structure of a three-dimensional model of an acoustic wave device provided with a frame-shaped section.

Then, additional mass film portions 33a through 33d were additional to the acoustic wave device 31 of the above-described three-dimensional model, as shown in FIG. 9A. The additional mass film portions 33a through 33d form a rectangular or substantially rectangular frame-shaped section. The width of the additional mass film portions 33a and 33c extending in the first direction A and located on the corresponding sides of the second direction B was set to about 1.6 μm. The width of the additional mass film portions 33b and 33d extending in the second direction B and located on the corresponding sides of the first direction A was also set to about 1.6 μm. The thickness of the additional mass film portions 33a through 33d was set to about 0.22 μm. The resonance characteristics of the three-dimensional model configured as described above are shown in FIG. 9B.

Figure 9B:
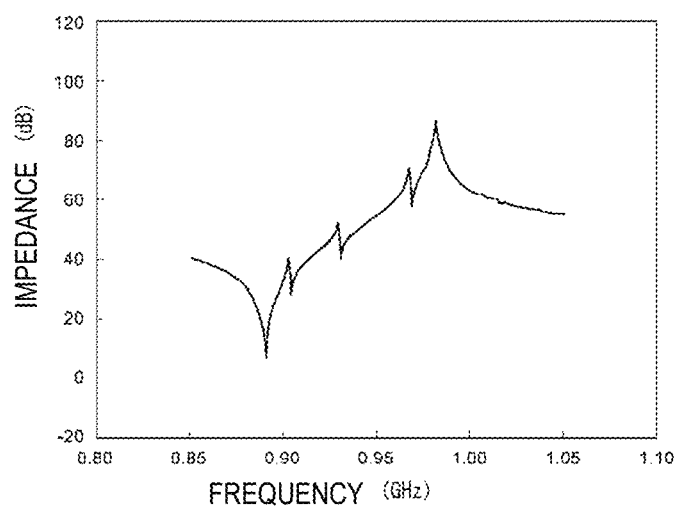
FIG. 9B is a diagram illustrating the resonance characteristics of the three-dimensional model provided with a frame-shaped section.

By providing the additional mass film portions 33a through 33d, spurious responses in the resonance characteristics in FIG. 9B become smaller than those in FIG. 8. However, three large spurious responses still appear between the resonant frequency and the anti-resonant frequency.

Figure 10A:
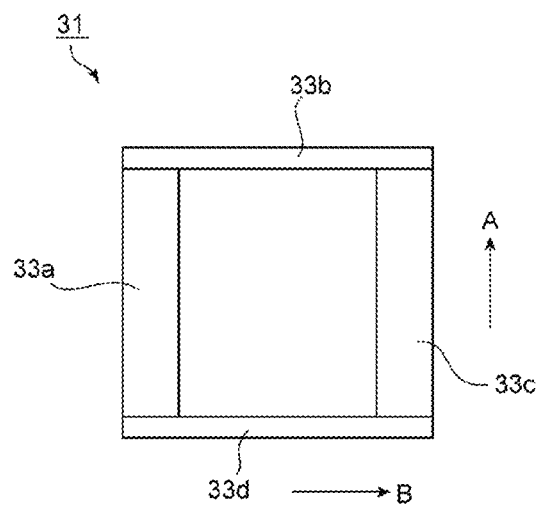
FIG. 10A is a schematic plan view for explaining an acoustic wave device having a structure in which the width of a frame-shaped section perpendicular or substantially perpendicular to the 130° direction is about 1.6 µm, while the width of the frame-shaped section perpendicular or substantially perpendicular to the 40° direction is about 3.1 µm.
Figure 10B:
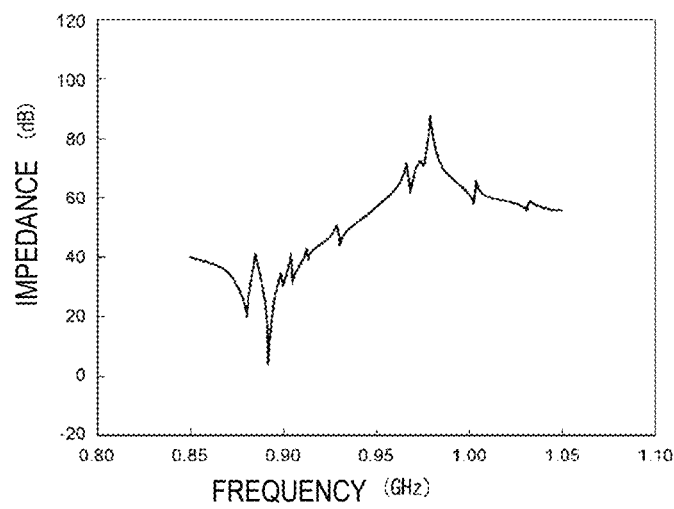
FIG. 10B is a diagram illustrating the resonance characteristics of an acoustic wave device having a structure in which an optimal frame-shaped section for the second direction B is provided in the first direction A, while an optimal frame-shaped section for the first direction A is provided in the second direction B.

Then, as shown in FIG. 10A, in the acoustic wave device 31 of the above-described three-dimensional model, the width of the additional mass film portions 33b and 33d provided on the corresponding sides of the direction of the angle φ of about 130°, that is, the first direction A, was set to about 1.6 μm, while the width of the additional mass film portions 33a and 33c located perpendicular to the direction of the angle φ of about 40°, that is, the second direction B, was set to about 3.1 μm. This configuration corresponds to the structure in which the width of the additional mass film portions 33a and 33c provided on the corresponding sides of the second direction B is optimized for the first direction A, while the width of the additional mass film portions 33b and 33d provided on the corresponding sides of the first direction A is optimized for the second direction B. The resonance characteristics in this configuration are shown in FIG. 10B. FIG. 10B shows that spurious responses are still observed between the resonant frequency and the anti-resonant frequency.

Then, in the above-described three-dimensional model, the width of the additional mass film portions 33b and 33d provided on the corresponding sides of the direction of the angle φ of about 130°, that is, the first direction A, was set to about 3.1 μm, while the width of the additional mass film portions 33a and 33c provided on the corresponding sides of the direction of the angle φ of about 40°, that is, the second direction B, was set to about 1.6 μm. The resonance characteristics in this configuration are shown in FIG. 11A.

Figure 11A:
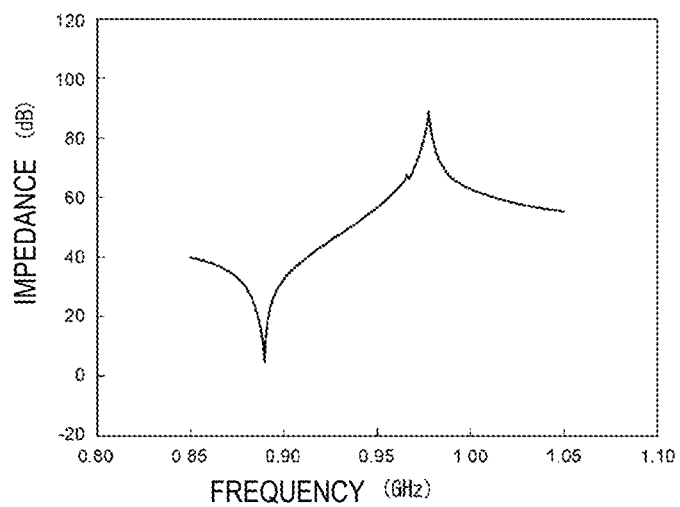
FIG. 11A is a diagram illustrating the resonance characteristics of the structure of the three-dimensional model shown in FIG. 7 in which an optimal frame-shaped section is provided in the first direction A and an optimal frame-shaped section is provided in the second direction B.

FIG. 11A shows that, if the optimal additional mass film portions obtained in the two-dimensional model are provided in the individual directions, no spurious responses are observed between the resonant frequency and the anti-resonant frequency.

Figure 11B:
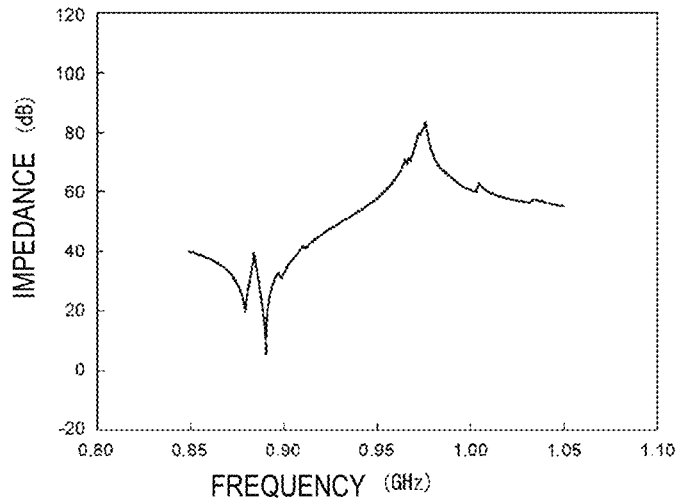
FIG. 11B is a diagram illustrating the resonance characteristics of the three-dimensional model shown in FIG. 7 in which an optimal frame-shaped section for the second direction B is provided both in the first direction A and the second direction B.

For the above-described three-dimensional model, when the widths of the additional mass film portions 33a through 33d were all set to about 3.1 μm, the resonant characteristics shown in FIG. 11B were obtained. A large spurious response is found near the resonant frequency, and some small spurious responses are observed between the resonant frequency and the anti-resonant frequency.

As described above, if the configuration of the additional mass film portions on the corresponding sides of the first direction A and that of the additional mass film portions on the corresponding sides of the second direction B are adjusted in accordance with the propagation pattern of acoustic waves in the first direction A and that in the second direction B, spurious responses in the resonance characteristics can be sufficiently reduced or prevented. Thus, in the present preferred, in the above-described second region, the configuration of additional mass film portions on the corresponding sides of the first direction A in a plane of a piezoelectric member and that of additional mass film portions on the corresponding sides of the second direction B in this plane are provided differently from each other. This can compensate for the anisotropic properties within a plane of the piezoelectric member, thus obtaining high resonance characteristics.

In the present preferred embodiment, in the second region, the above-configured additional mass film portions on the corresponding sides of the first direction A and those on the corresponding sides of the second direction B may be provided, not only on the first electrode 3, but also on the second electrode 4, as indicated by the broken lines in FIGS. 1B and 1C. The additional mass film portions may be provided only on the second electrode 4, instead of on the first electrode 3. That is, the additional mass film 6 may be disposed on at least one of the first electrode 3 and the second electrode 4.

In FIGS. 10A and 10B, the widths of the additional mass film portions 33a through 33d may have a relationship expressed by "the width of the additional mass film portion 33b<the width of the additional mass film portion 33d<the width of the additional mass film portion 33a<the width of the additional mass film portion 33c". That is, the widths of the additional mass film portions extending in the same or substantially the same direction may be made different. In this manner, the additional mass film portions extending in the same or substantially the same direction may have different shapes. The additional mass film portions may be provided asymmetrically with respect to the first region.

The magnitude of the width of the additional mass film portion 33b and that of the additional mass film portion 33d may be reversed, while the magnitude of the width of the additional mass film portion 33a and that of the additional mass film portion 33c may be reversed.

Figure 12A:
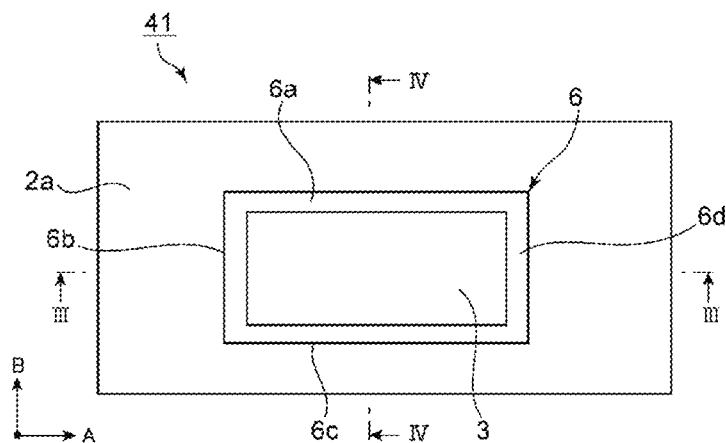
FIG. 12A is a plan view of an acoustic wave device according to a second preferred embodiment of the present invention.
Figure 12B:
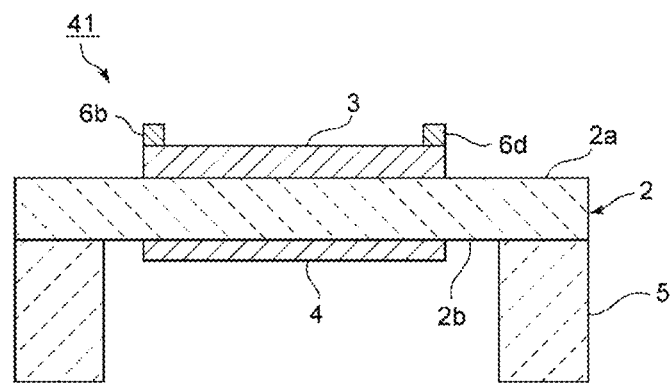
FIG. 12B is a front sectional view of the acoustic wave device.
Figure 12C:
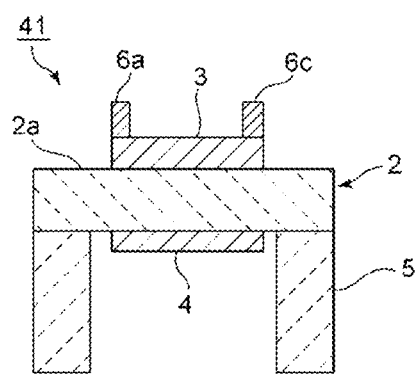
FIG. 12C is a right-side sectional view of the acoustic wave device.

FIG. 12A is a plan view of an acoustic wave device according to a second preferred embodiment of the present invention. FIG. 12B is a sectional view taken along line III-III in FIG. 12A. FIG. 12C is a sectional view taken along line IV-IV in FIG. 12A. An acoustic wave device 41 is different from the acoustic wave device 1 of the first preferred embodiment in the configuration of the additional mass film 6. The configurations of the other portions of the acoustic wave device 41 are the same as or similar to those of the acoustic wave device 1.

In the acoustic wave device 41, the additional mass film 6 is made of the same material as the first electrode 3. Alternatively, the additional mass film 6 may be made of a material different from the first electrode 3. An example of a material different from the first electrode 3 is a suitable metal, alloy, or insulator.

In the additional mass film 6, the height of the additional mass film portions 6a and 6c on the long sides located on the corresponding sides of the second direction B is higher than that of the additional mass film portions 6b and 6d on the short sides located on the corresponding sides of the first direction A. In this manner, the configuration on the corresponding sides of the first direction A and that on the corresponding sides of the second direction B may be provided differently by setting different heights for the additional mass film portions 6b and 6d on the short sides and the additional mass film portions 6a and 6c on the long sides. In this case, as well, spurious responses in the resonance characteristics can be effectively reduced or prevented, as in the acoustic wave device 1 of the first preferred embodiment.

In accordance with the direction, the width of the additional mass film portions is varied in the first preferred embodiment, while the height of the additional mass film portions is varied in the second preferred embodiment. Instead of the weight or the height, the material for the additional mass film portions may be changed. More specifically, the material for the additional mass film portions 6b and 6d on the short sides, which are those on the corresponding sides of the first direction A, and the material for the additional mass film portions 6a and 6c on the long sides, which are those on the corresponding sides of the second direction B, may be made different from each other. To change the configuration on the corresponding sides of the first direction A and that on the corresponding sides of the second direction B from each other, two or more of the width, thickness, and material of the additional mass film portions may be varied. More specifically, at least one of the width, thickness, and material can be made different between the additional mass film portions on the corresponding sides of the first direction A and those on the corresponding sides of the second direction B.

Figure 13A:
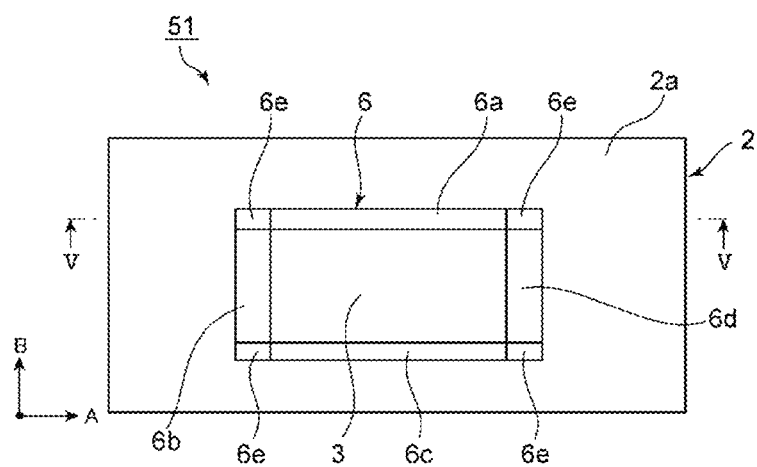
FIG. 13A is a plan view of an acoustic wave device according to a third preferred embodiment of the present invention.
Figure 13B:
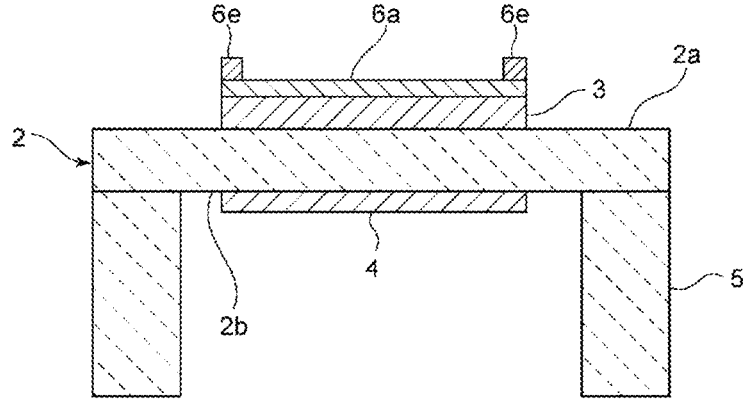
FIG. 13B is a sectional view taken along line V-V in FIG. 13A.

FIG. 13A is a plan view of an acoustic wave device according to a third preferred embodiment of the present invention. FIG. 13B is a sectional view taken along line V-V in FIG. 13A.

In an acoustic wave device 51, the height of corner portions 6e in a plan view of the additional mass film 6 is higher than the other portions of the additional mass film 6. That is, the height of the corner portions 6e is higher than that of the additional mass film portions 6a and 6c on the long sides and that of the additional mass film portions 6b and 6d on the short sides sandwiched between the corner portions 6e. In this case, as well, the width of the additional mass film portions 6b and 6d on the short sides is larger than that of the additional mass film portions 6a and 6c on the long sides. It is thus possible to effectively reduce or prevent spurious responses that may appear in the resonance characteristics, as in the acoustic wave device 1 of the first preferred embodiment.

Figure 14A:
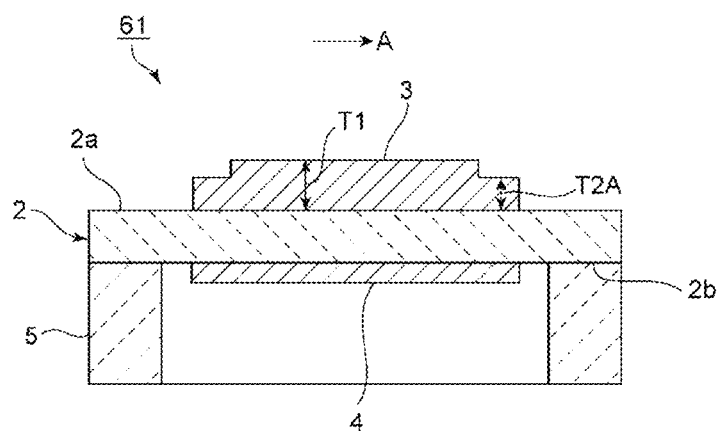
FIGS. 14A and 14B are respectively a front sectional view and a right-side sectional view of an acoustic wave device according to a fourth preferred embodiment of the present invention.
Figure 14B:
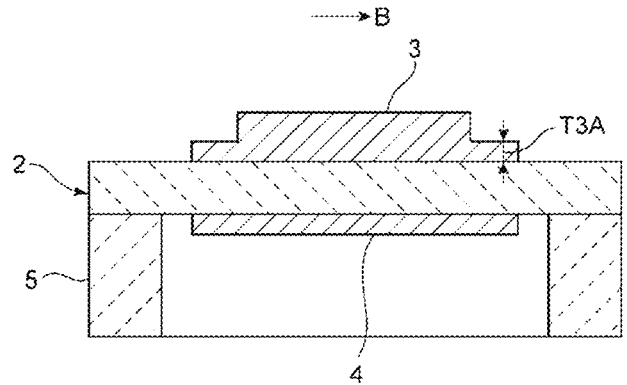

FIGS. 14A and 14B are respectively a front sectional view and a side sectional view of an acoustic wave device according to a fourth preferred embodiment of the present invention.

In an acoustic wave device 61, the first electrode 3 is disposed on the first main surface 2a of the piezoelectric member 2, while the second electrode 4 is disposed on the second main surface 2b. The first electrode 3 and the second electrode 4 have a rectangular or substantially rectangular shape, as viewed from above. In the second region surrounding the first region, the thickness of the first electrode 3 is thinner. That is, as viewed from above, a rectangular or substantially rectangular frame-shaped section is provided as a depressed section around the first region. The thickness T2A and the thickness T3A of the first electrode 3 in the second region are thus thinner than the thickness T1 in the first region, as shown in FIGS. 14A and 14B.

Additionally, the thickness T2A is larger than the thickness T3A (T2A>T3A). In this manner, the thickness T2A of the portions of the first electrode 3 located on the corresponding sides of the first direction A and the thickness T3A of the portions of the first electrode 3 located on the corresponding sides of the second direction B are different from each other. Since the thickness of the first electrode 3 in the second region is varied as described above, although the piezoelectric member 2 has anisotropic properties, spurious responses that may appear in the resonance characteristics can be effectively reduced or prevented, as in the acoustic wave device 1.

The configurations of the other portions of the acoustic wave device 61 are the same as or similar to those of the acoustic wave device 1.

Figure 15A:
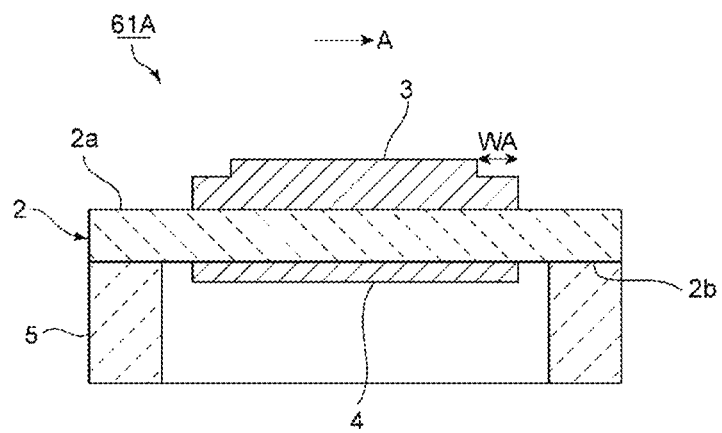
FIGS. 15A and 15B are respectively a front sectional view and a right-side sectional view of an acoustic wave device according to a fifth preferred embodiment of the present invention.
Figure 15B:
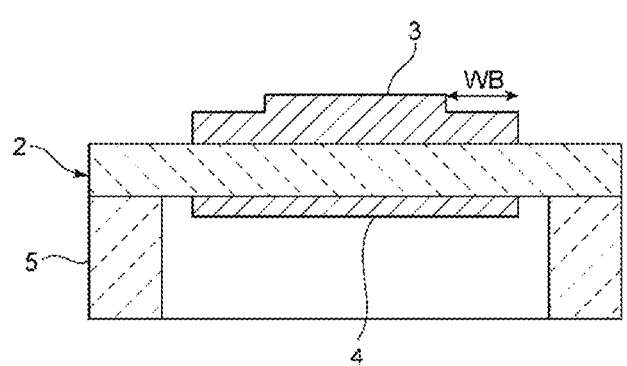

FIGS. 15A and 15B are respectively a front sectional view and a side sectional view for explaining an acoustic wave device according to a fifth preferred embodiment of the present invention. In an acoustic wave device 61A, the width of the frame-shaped depressed section of the second region is varied between portions on the corresponding sides of the first direction A and portions on the corresponding sides of the second direction B. More specifically, the width WB of the frame-shaped depressed section on the corresponding sides of the second direction B is larger than the width WA of the frame-shaped depressed section on the corresponding sides of the first direction A. In this manner, the width of the depressed section may be made different between the portions on the corresponding sides of the first direction A and those on the corresponding sides of the second direction B. In this case, as well, spurious responses that may appear in the resonance characteristics can be effectively reduced or prevented, as in the acoustic wave device 1 of the first preferred embodiment.

The configuration of the fourth preferred embodiment and that of the acoustic wave device 61A shown in FIGS. 15A and 15B may be combined with each other.

Figure 16A:
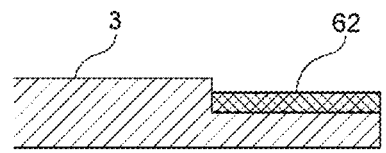
FIGS. 16A through 16C are partially cutaway front sectional views for explaining modified examples in which an insulating film is provided in a frame-shaped depressed section of a second region.
Figure 16B:
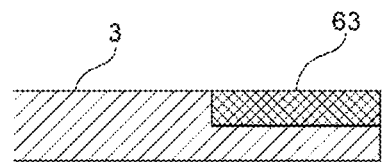
Figure 16C:
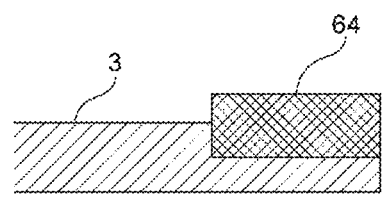

FIGS. 16A through 16C are partially cutaway front sectional views for explaining the structure in which an insulating film is provided in the frame-shaped depressed section. In FIG. 16A, an insulating film 62 having a thickness smaller than the depth of the depressed section is disposed on the depressed section. In FIG. 16B, an insulating film 63 having a thickness equivalent to the depth of the depressed section is disposed on the depressed section. In FIG. 16C, an insulating film 64 having a thickness larger than the depth of the depressed section is disposed on the depressed section. In this manner, the insulating film 62, 63, or 64 may be disposed in the depressed section. Instead of using the insulating film 62, 63, or 64, another material different from that of the first electrode 3 and the second electrode 4 may be used.

Figure 17A:
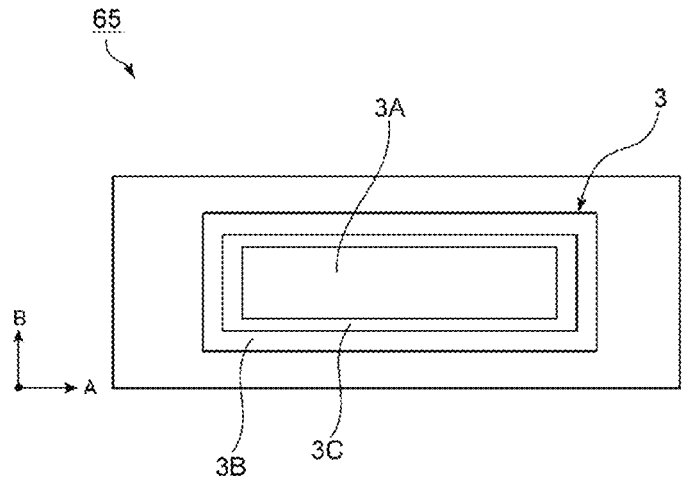
FIGS. 17A and 17B are respectively a plan view and a front sectional view for explaining an acoustic wave device according to a sixth preferred embodiment of the present invention.
Figure 17B:
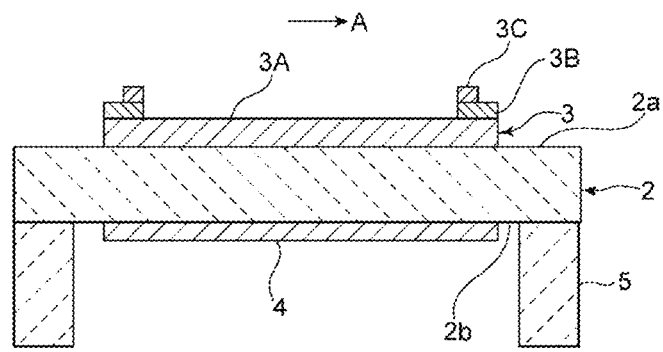

FIGS. 17A and 17B are respectively a plan view and a front sectional view of an acoustic wave device according to a sixth preferred embodiment of the present invention. In an acoustic wave device 65, the first electrode 3 includes a multilayer body including first through third layers 3A through 3C. The first layer 3A has a rectangular or substantially rectangular shape and is disposed on the first main surface 2a of the piezoelectric member 2. The second layer 3B has a rectangular or substantially rectangular frame-shaped shape, and the outer peripheral edge of this rectangular or substantially rectangular frame-shaped shape matches that of the first layer 3A. The third layer 3C has a rectangular or substantially rectangular frame-shaped shape, and the outer shape of the third layer 3C is smaller than that of the second layer 3B. The inner peripheral edge of the second layer 3B and that of the third layer 3C match or substantially match each other. In the acoustic wave device 65, the second layer 3B and the third layer 3C of the first electrode 3 define and function as an additional mass film. As viewed from above, the region where the first electrode 3 and the second electrode 4 overlap each other includes a first region, a second region, and a third region. More specifically, the region surrounded by the second layer 3B and the third layer 3C is the first region. The region where the third layer 3C is disposed is the second region. In the present preferred embodiment, in the second region, the width of the third layer 3C as additional mass film portions on the corresponding sides of the first direction A and that of the third layer 3C as additional mass film portions on the corresponding sides of the second direction B are different from each other. Thus, as in the acoustic wave device 1 of the first preferred embodiment, it is possible to compensate for the anisotropic properties of the piezoelectric member 2, so as to effectively reduce or prevent spurious responses that may appear in the resonance characteristics.

In the present preferred embodiment, a rectangular or substantially rectangular frame-shaped third region, which is disposed outward of the third layer 3C and overlaps the second layer 3B, is provided outward of the second region. In this manner, the third region may also be provided outward of the second region.

Figure 18:
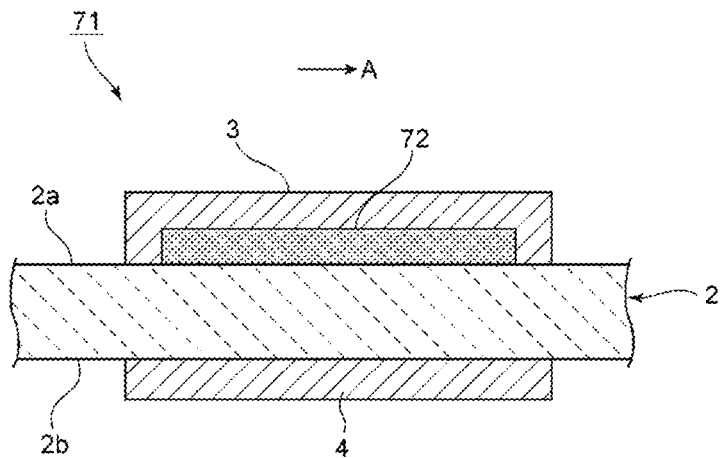
FIG. 18 is a partially cutaway front sectional view for explaining an acoustic wave device according to a seventh preferred embodiment of the present invention.

FIG. 18 is a partially cutaway front sectional view for explaining an acoustic wave device according to a seventh preferred embodiment of the present invention. In an acoustic wave device 71, an insulating layer 72 is provided on the first main surface 2a of the piezoelectric member 2. The insulating layer 72 is made of a suitable insulator, such as, for example, silicon dioxide.

The first electrode 3 is provided to cover the insulating layer 72. The insulating layer 72 has a rectangular or substantially rectangular planar shape.

The first electrode 3 has a larger shape than the insulating layer 72, as viewed from above. That is, the insulating layer 72 is located within the first electrode 3, as viewed from above. A rectangular or substantially rectangular frame-shaped second region is thus provided around the insulating layer 72. The portion where the insulating layer 72 is provided corresponds to a first region. In the second region outward of the first region, the thickness of the first electrode 3 on the corresponding sides of the first direction A and that of the first electrode 3 on the corresponding sides of the second direction B are made different from each other. A portion of the first electrode 3 located in the second region corresponds to the above-described additional mass film.

Figure 19A:
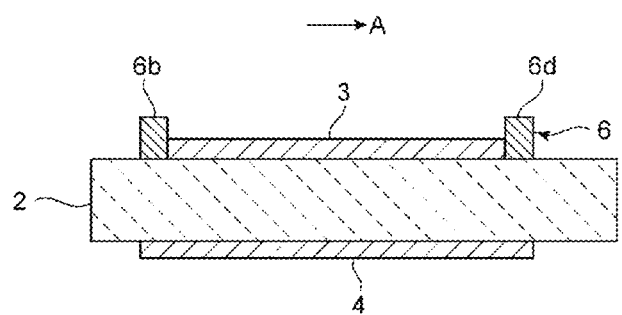
FIGS. 19A and 19B are front sectional views of acoustic wave devices for explaining modified examples of the frame-shaped section.
Figure 19B:
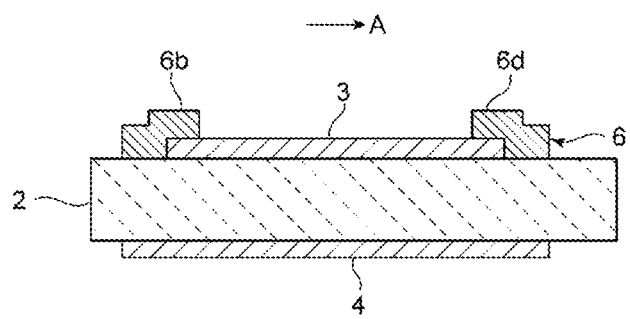

FIGS. 19A and 19B are front sectional views of acoustic wave devices for explaining modified examples of frame-shaped sections according to preferred embodiments of the present invention.

As shown in FIG. 19A, a frame-shaped section including the additional mass film 6 may be provided outward of the first electrode 3. In FIG. 19A, as viewed from above, the region where at least one of the first electrode 3 and the additional mass film 6 overlaps the second electrode 4 includes a first region and a second region. The region where the first electrode 3 and the second electrode 4 oppose each other with the piezoelectric member interposed therebetween is the first region. In the second region outward of the first region, the additional mass film 6 is provided. Additional mass film portions 6b and 6d are disposed outward of the first electrode 3 with respect to the first direction A. Additional mass film portions are also disposed outward of the first electrode 3 with respect to the second direction B, though they are not shown.

As shown in FIG. 19B, a frame-shaped section including the additional mass film 6 may be disposed in a region from the top surface of the first electrode 3 to the outward of the first electrode 3. In FIG. 19B, additional mass film portions 6b and 6d on the corresponding sides of the first direction A are shown. Additional mass film portions on the corresponding sides of the second direction B can also be provided in a similar manner.

In preferred embodiments of the present invention, an additional mass film is provided in at least one of an area on the first electrode or the second electrode and an area outward of the first electrode or the second electrode.

Figure 20:
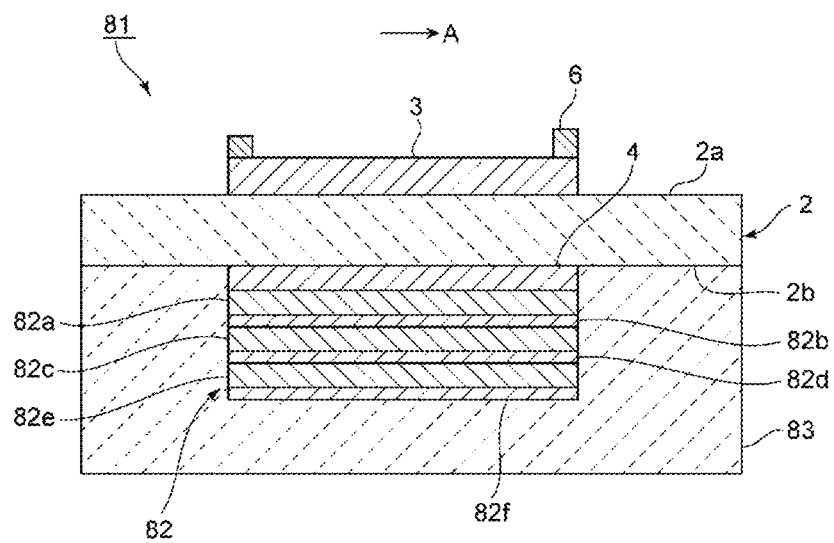
FIG. 20 is a front sectional view for explaining an acoustic wave device according to an eighth preferred embodiment of the present invention.

FIG. 20 is a front sectional view of an acoustic wave device according to an eighth preferred embodiment of the present invention. In an acoustic wave device 81, an acoustic reflector 82 is provided on the second main surface 2b of the piezoelectric member 2. A support substrate 83 is disposed around the acoustic reflector 82. The acoustic reflector 82 is disposed on the bottom surface of the second electrode 4. The acoustic reflector 82 includes a multilayer body including low acoustic impedance layers 82a, 82c, and 82e, which are low acoustic impedance films having a relatively low acoustic impedance, and high acoustic impedance layers 82b, 82d, and 82f, which are high acoustic impedance films having a relatively high acoustic impedance. In this manner, the acoustic reflection section in preferred embodiments of the present invention is not limited to an air gap and may include the acoustic reflector 82.

The materials of the low acoustic impedance layers 82a, 82c, and 82e and the high acoustic impedance layers 82b, 82d, and 82f are not limited to a particular material as long as it satisfies the above-described acoustic impedance relationship.

In the acoustic wave device 81, the configuration of the additional mass film 6 provided on the first electrode 3 is the same as or similar to that of the first preferred embodiment. It is thus possible to effectively reduce or prevent spurious responses that may appear in the resonance characteristics, as in the first preferred embodiment.

In the above-described preferred embodiments, the excitation region is rectangular or substantially rectangular, while the second region is a rectangular or substantially rectangular frame-shaped section. In an acoustic wave device of preferred embodiments of the present invention, the excitation region may have a polygonal or substantially polygonal shape other than a rectangular or substantially rectangular shape. In this case, the frame-shaped section in the second region has a planar shape corresponding to the polygonal or substantially polygonal shape of the excitation region.

Modified examples of the frame-shaped section are shown in FIGS. 21A through 21D, FIGS. 22A, and 22B.

Figure 21A:
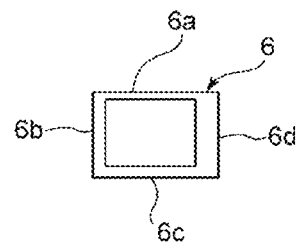
FIGS. 21A through 21D are schematic plan views for explaining modified examples of the planar shape of the frame-shaped section.

In the additional mass film 6 shown in FIG. 21A, the widths of the opposing additional mass film portions 6a and 6c are different, and the widths of the opposing additional mass film portions 6b and 6d are also different. In this manner, the widths of opposing additional mass film portions may be different from each other.

Figure 21B:
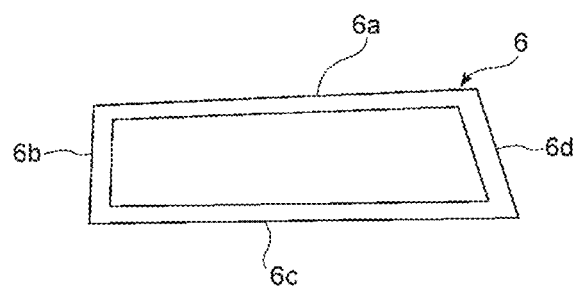

As shown in FIG. 21B, the additional mass film portions 6a and 6c may be nonparallel, and the additional mass film portions 6b and 6d may also be nonparallel.

Figure 21C:
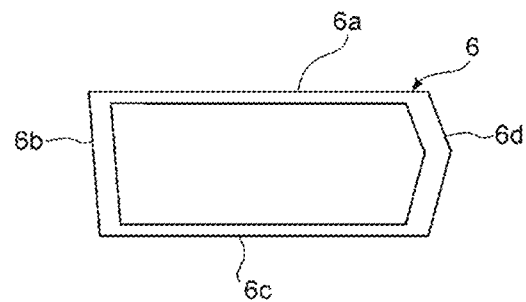

As in the modified example in FIG. 21C, the additional mass film portion 6d is bent. In this manner, the additional mass film 6 may include a nonlinear portion.

Figure 21D:
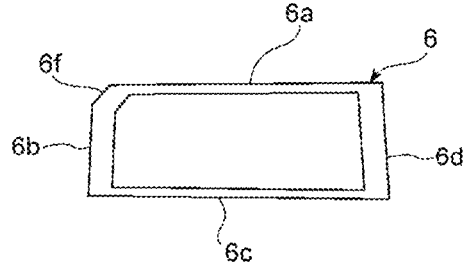

As shown in FIG. 21D, in a rectangular or substantially rectangular additional mass film 6, a corner portion connecting the additional mass film portions 6a and 6b may cut out, and a tilt portion 6f may be provided, as viewed from above.

Figure 22A:
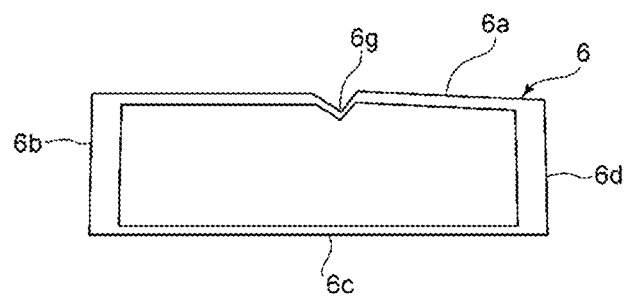
FIGS. 22A and 22B are schematic plan views for explaining other modified examples of the planar shape of the frame-shaped section.
Figure 22B:
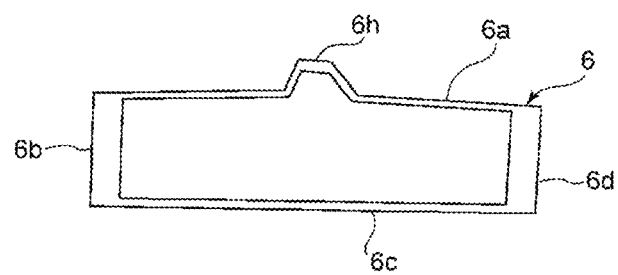

As shown in FIG. 22A, a recess 6g which flares out outward may be provided in a linear additional mass film portion 6a. As shown in FIG. 22B, a projection 6h projecting outward may be provided in the additional mass film portion 6a.

Acoustic wave devices according to preferred embodiments of the present invention can be suitably used as an acoustic wave resonator. Preferred embodiments of the present invention are also applicable to an acoustic wave filter including such an acoustic wave resonator, for example.

Figure 23:
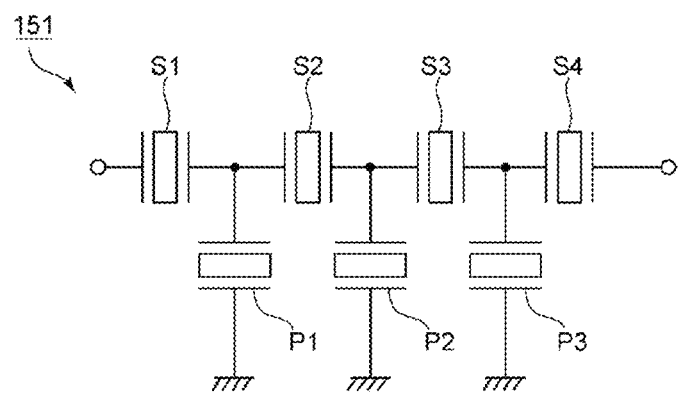
FIG. 23 is a circuit diagram of an acoustic wave filter according to a ninth preferred embodiment of the present invention.

FIG. 23 is a circuit diagram of an acoustic wave filter according to a ninth preferred embodiment of the present invention. An acoustic wave filter 151 includes series arm resonators S1 through S4 and parallel arm resonators P1 through P3. The series arm resonators S1 through S4 and the parallel arm resonators P1 through P3 are each defined by an acoustic wave resonator. Acoustic wave devices according to preferred embodiments of the present invention can be used as at least one of the plural acoustic wave resonators of a ladder filter.

Acoustic wave filters according to preferred embodiments of the present invention are not restricted to the ladder filter shown in FIG. 23, and are applicable to various acoustic wave filters including plural acoustic wave resonators.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric member including a first main surface and a second main surface opposing each other and having anisotropic properties in a plane parallel or substantially parallel with the first and second main surfaces;
a first electrode on the first main surface of the piezoelectric member;
a second electrode on the second main surface of the piezoelectric member and opposing the first electrode with the piezoelectric member interposed therebetween;
an acoustic reflection section on a surface of the second electrode different from a surface of the second electrode on the piezoelectric member; and
an additional mass film for at least one of the first electrode and the second electrode, the additional mass film being in at least one of an area on the first electrode or the second electrode and an area outward of the first electrode or the second electrode; wherein
as viewed from above, a region where at least one of the first electrode and the additional mass film overlaps the second electrode includes a first region and a second region, the second region surrounding the first region;
in the second region, a configuration of additional mass film portions of the additional mass film located on corresponding sides of a first direction in a plane of the piezoelectric member and a configuration of additional mass film portions of the additional mass film located on corresponding sides of a second direction, the second direction being different from the first direction, in the plane of the piezoelectric member are different from each other;
the additional mass film is in the second region and defines a frame-shaped projecting section; and
at least one of a thickness and a material of the frame-shaped projecting section is different between each of the additional mass film portions on the corresponding sides of the first direction and each of the additional mass film portions on the corresponding sides of the second direction.

2. The acoustic wave device according to claim 1, wherein the piezoelectric member is made of a single-crystal piezoelectric material.

3. The acoustic wave device according to claim 2, wherein the piezoelectric member is made of $LiTaO_3$ or $LiNbO_3$.

4. The acoustic wave device according to claim 1, wherein the second region is the frame-shaped projecting section, and a thickness of the additional mass film in corner portions of the frame-shaped projecting section is thicker than a thickness of the additional mass film in other portions of the frame-shaped projecting section in the second region.

5. The acoustic wave device according to claim 1, wherein the additional mass film is integrally provided with at least one of the first electrode and the second electrode and is made of a same material as a material of the at least one of the first electrode and the second electrode.

6. The acoustic wave device according to claim 1, wherein the additional mass film is made of a material different from a material of the first electrode and the second electrode.

7. The acoustic wave device according to claim 1, wherein the second direction is a direction perpendicular or substantially perpendicular to the first direction.

8. The acoustic wave device according to claim 1, wherein a region where the first electrode and the second electrode oppose each other is an excitation region; and the excitation region has a rectangular or substantially rectangular shape, as viewed from above.

9. The acoustic wave device according to claim 1, wherein the acoustic wave device uses a bulk wave in a thickness shear mode.

10. The acoustic wave device according to claim 1, wherein the acoustic wave device uses a bulk wave in a thickness longitudinal mode.

11. The acoustic wave device according to claim 1, wherein
the acoustic reflection section includes an air gap; and
the acoustic wave device includes a support on the second main surface of the piezoelectric member so as to provide the air gap.

12. The acoustic wave device according to claim 1, wherein the acoustic reflection section is an acoustic reflector including a multilayer body including a low acoustic impedance film and a high acoustic impedance film, the low acoustic impedance film having a relatively low acoustic impedance, the high acoustic impedance film having a relatively high acoustic impedance.

13. An acoustic wave filter comprising:
a plurality of acoustic wave resonators,
wherein at least one of the acoustic wave resonators is the acoustic wave device according to claim 1.

14. An acoustic wave device comprising:
a piezoelectric member including a first main surface and a second main surface opposing each other and having anisotropic properties in a plane parallel or substantially parallel with the first and second main surfaces;
a first electrode on the first main surface of the piezoelectric member;
a second electrode on the second main surface of the piezoelectric member and opposing the first electrode with the piezoelectric member interposed therebetween; and
an acoustic reflection section on a surface of the second electrode different from a surface of the second electrode on the piezoelectric member; wherein
an excitation region where the first electrode and the second electrode oppose each other includes a first region and a second region, the second region surrounding the first region;
a thickness of at least one of the first electrode and the second electrode in the second region is less than a thickness of the at least one of the first electrode and the second electrode in the first region, and, in the second region, a configuration of the at least one of the first electrode and the second electrode located on corresponding sides of a first direction in a plane of the piezoelectric member and a configuration of the at least one of the first electrode and the second electrode located on corresponding sides of a second direction, the second direction being different from the first direction, in the plane of the piezoelectric member are different from each other;
the first electrode and the second electrode have a rectangular or substantially rectangular shape;

in the second region, a thickness of the side of at least one of the first electrode and the second electrode located on each of corresponding sides of the first direction and a thickness of the side of the at least one of the first electrode and the second electrode located on each of corresponding sides of the second direction are different from each other; and in the second region, a width of the at least one of the first electrode and the second electrode on at least one of the corresponding sides of the first direction and the corresponding sides of the second direction is constant or substantially constant along the corresponding one of the first direction or the second direction.

15. The acoustic wave device according to claim 14, wherein the second region defines a frame-shaped depressed section.

16. An acoustic wave filter comprising:
a plurality of acoustic wave resonators,
wherein at least one of the acoustic wave resonators is the acoustic wave device according to claim 14.

* * * * *